(12) United States Patent
Kraft et al.

(10) Patent No.: US 8,217,476 B2
(45) Date of Patent: Jul. 10, 2012

(54) MICROMECHANICAL COMPONENT AND METHOD FOR THE MANUFACTURE THEREOF

(75) Inventors: Karl-Heinz Kraft, Herrenberg (DE); Simon Armbruster, Wannweil (DE); Arnim Hoechst, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 216 days.

(21) Appl. No.: 12/817,937

(22) Filed: Jun. 17, 2010

(65) Prior Publication Data

US 2011/0001200 A1 Jan. 6, 2011

(30) Foreign Application Priority Data

Jun. 25, 2009 (DE) .......................... 10 2009 027 180

(51) Int. Cl.
*H01L 21/00* (2006.01)

(52) U.S. Cl. .................... 257/419; 257/E21.305; 438/53
(58) Field of Classification Search .................... 438/53
See application file for complete search history.

(56) References Cited

U.S. PATENT DOCUMENTS

2009/0127640 A1* 5/2009 Benzel et al. ................. 257/419

FOREIGN PATENT DOCUMENTS

| DE | 10 2004 036 035 | 7/2005 |
| DE | 10 2007 043 526 | 3/2009 |
| DE | 10 2008 001 738 | 11/2009 |

* cited by examiner

*Primary Examiner* — David S Blum
*Assistant Examiner* — Khaja Ahmad
(74) *Attorney, Agent, or Firm* — Kenyon & Kenyon LLP

(57) ABSTRACT

A method for manufacturing a micromechanical component and the micromechanical component produced thereby. This component is preferably a diaphragm or a diaphragm layer which is independently produced for the purpose of subsequent assembly with other components.

10 Claims, 5 Drawing Sheets

MICROMECHANICAL COMPONENT AND METHOD FOR THE MANUFACTURE THEREOF

FIELD OF THE INVENTION

The present invention relates to a micromechanically produced component having a diaphragm, as well as a method for the manufacture thereof.

BACKGROUND INFORMATION

In micromechanics, sensors are known in which a pressure variable is detected as a function of the flexure of a diaphragm. Detection is via piezoelectric resistors, among other things, which are incorporated into the diaphragm or produced separately on the diaphragm. A diaphragm of this type is usually manufactured by an epitactic method in which layers are applied to a substrate, the substrate material being subsequently etched to produce a cavity beneath the diaphragm.

Methods are also known from German Patent Nos. DE 10 2007 043526 and DE 10 2008 001738, in which a substrate is used to produce a diaphragm which is removed from the substrate after producing a cavity beneath the diaphragm for the purpose of processing the diaphragm separately. One or more supporting points are usually provided beneath the diaphragm, which are easily broken off when the diaphragm is lifted.

SUMMARY OF THE INVENTION

According to the present invention, a micromechanical method for producing a component or a chip as well as the resulting component are provided. This component or this chip is preferably a diaphragm or a diaphragm layer which is independently produced for the purpose of subsequent assembly with other components. For this purpose, a first structured area is first produced in the surface of a (semiconductor) substrate, for example by suitable structuring with the aid of a doping method, which subsequently defines a supporting area. A structured layer is then produced on or in the substrate surface above the first area, which subsequently permits the formation of a diaphragm layer or at least a portion thereof. Due to the structured layer, at least a portion of the substrate material is then removed from the substrate beneath the structured layer. However, care must be taken to ensure that the structured layer or the diaphragm layer remains connected to the substrate at least over the first area. It is also optionally possible for mechanical connections to likewise occur on the edge of the structured layer or the diaphragm layer. The structured layer or diaphragm layer is subsequently separated from the substrate by a lifting process in which the supporting areas in the first area and, if necessary, also in the edge areas are selectively mechanically broken. The advantage of the present invention lies in the fact that uncontrolled mechanical breakage, which may even spread to the diaphragm layer, is prevented due to the defined structuring of the first area and thus the supporting point. This avoids predefined break points in the diaphragm, giving the diaphragm layer a more stable design, for example when used as a carrier layer for a circuit (e.g., an ASIC) or in a pressure sensor.

The present invention is particularly advantageous if the first area has a broader base, and a thinner supporting point is provided thereupon. A design of this type makes it possible to guide the break point more precisely and thereby prevent uncontrolled breaking processes.

To provide as few supporting points as possible, the first areas are largely produced in the central area of the structured layer or diaphragm layer from which the component is made. This enables the breaking process to be carried out more easily by tilting the diaphragm layer slightly on one or multiple sides during lifting. However, it is also possible to situate the supporting points in a decentralized location or to distribute them in any desired manner.

In terms of process engineering, it is advantageous to produce the first area in the substrate by selective doping, for example, reverse-doping the substrate also being possible. Furthermore, the first area may be produced by multi-layer doping of the substrate, in which corresponding structures are produced, for example, at different depths in the substrate.

The first area is typically produced by n-doping.

The component or chip advantageously has circuit elements.

Further advantages are derived from the following description of exemplary embodiments or from the dependent claims.

DETAILED DESCRIPTION

Figure 1:
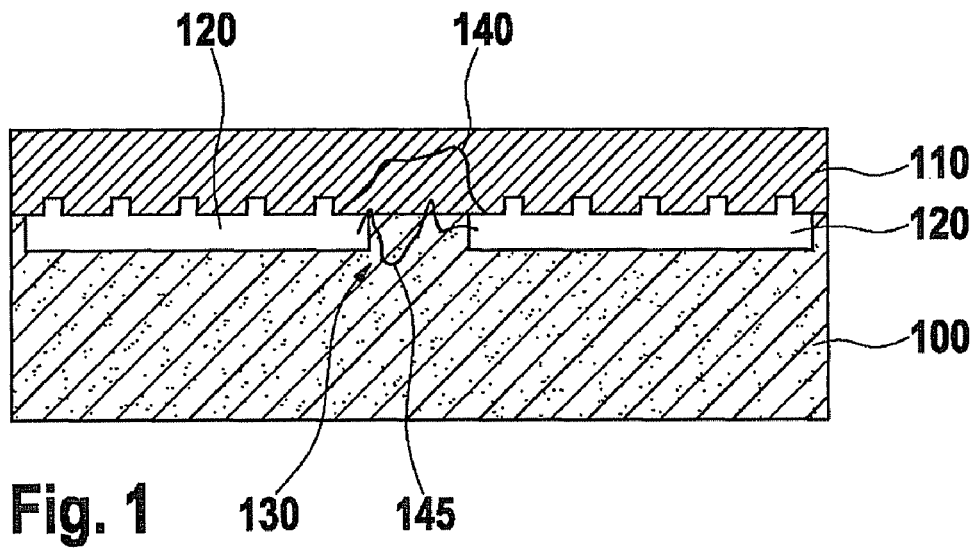
FIG. 1 shows a breaking process during a lifting process according to the related art.

As illustrated above, micromechanically produced components or chips may be manufactured by producing them separately using micromechanical means by first producing diaphragms on a substrate and subsequently separating them therefrom. FIG. 1 shows a structure of this type according to the related art. A plurality of diaphragms 110, beneath each of which a hollow space or cavity 120 is produced, are applied to a substrate 100. To support diaphragm 110, one or more supporting points 130 is/are provided within cavity 120. After diaphragm 110 is produced, it is gripped by a suitable gripper and removed from substrate 100. This is done using tilting movements in which the mechanical connections (i.e., supporting points 130 and any existing edge areas) between substrate 100 and diaphragm 110 are broken. The break points produced during this breaking process are nearly uncontrollable. Thus, in addition to advantageous break edges 145, which run completely outside the diaphragm, break edges 140 are also observed which run, in part, within the actual diaphragm 110. As shown in FIG. 1, such unfavorable break edges 140 are suitable for weakening diaphragm 110 at this point, since a predetermined break point is produced by these local thinner areas in the diaphragm, during use of diaphragm 110.

Figure 2A:
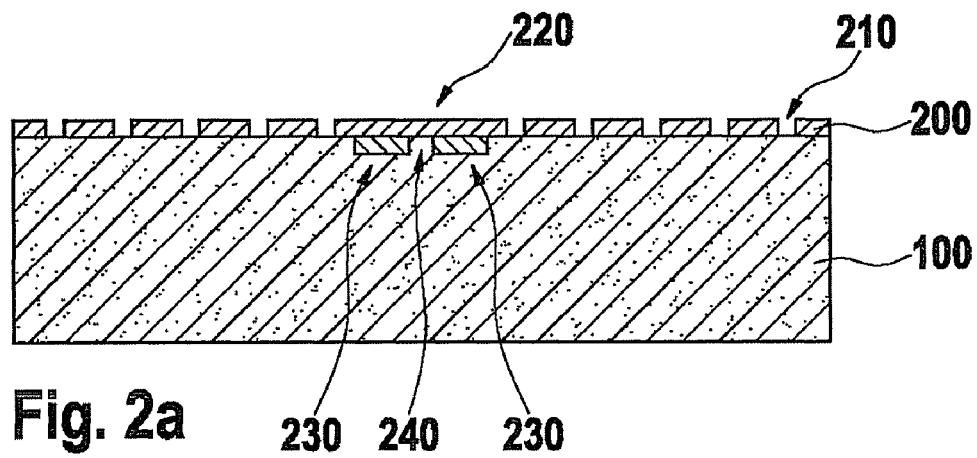
FIGS. 2a through 2c, 3a through 3d, 4 and 5a through 5c show different ways to define the supporting points more precisely for the purpose of avoiding uncontrolled breaking processes.
Figure 2B:
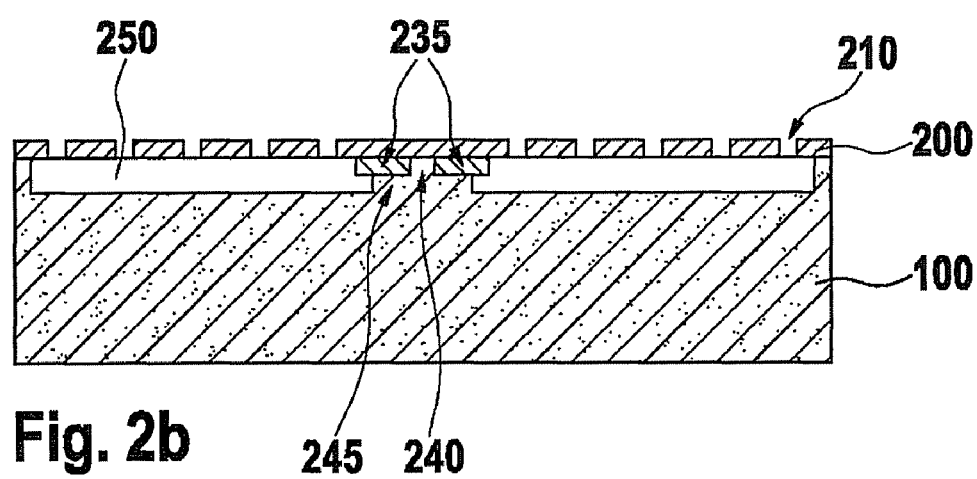
Figure 2C:
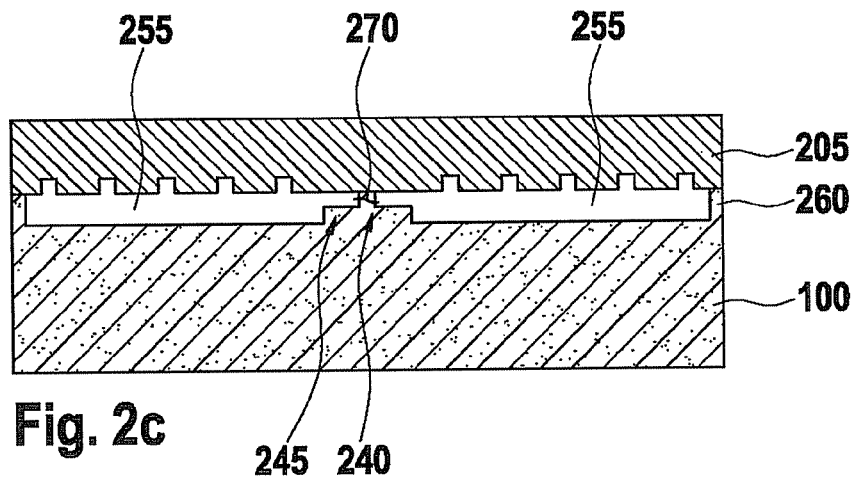

A first exemplary embodiment of the present invention for implementing a suitable structuring of a supporting point, which is intended to prevent uncontrolled breakage during removal of the components, is illustrated on the basis of FIGS. 2a through 2c. It is provided that manufacturing methods of this type usually provide a plurality of components on a substrate simultaneously, the lifting process at the end of the manufacturing method removing the components individually. For this purpose, it may be provided that the edges of the diaphragms are separated by a trench etching method or a sawing process in such a way that the diaphragm or component/chip remains connected to the substrate only at the supporting points.

Starting with a p-doped Si substrate 100, a supporting area is formed by first producing structured, buried areas 230 in the substrate which have a p-doping factor which is higher than that of actual substrate 100 and which surround supporting point 240. n-doped areas are subsequently introduced into the surface of substrate 100 for forming a contiguous diaphragm layer 200. This diaphragm layer 200 is structured in such a way that it has openings 210 through which the underlying substrate material is accessible, resulting in an n-type lattice known from the related art (refer, for example, to German Patent No. DE 10 2004 036035). Alternatively, it may also be provided to apply the n-type lattice epitactically to the substrate and to introduce only area 230 into the surface of substrate 100 for the purpose of structuring supporting point 240. To provide a better (mechanical) connection between the diaphragm or diaphragm layer 200 and substrate 100, it may be provided to produce a larger continuous area 220 in diaphragm layer 200 above supporting point 240.

To produce the cavity, an etching process is used in a further method step, as illustrated in FIG. 2b, to at least partially remove the substrate material in area 250 beneath diaphragm layer 200. Openings 210 in diaphragm layer 200 are used to conduct the etchant, which preferably etches the p-doped semiconductor material, to the substrate and to remove the substrate from area 250. It may optionally be provided to first etch the substrate to make it porous and to remove it in a later step or to relocate it in such a way that a cavity 320 is produced. This optional method step may be helpful if the diaphragm layer is first further processed, for example by completely or partially closing the openings to produce micromechanical or microelectric structures on the surface of the diaphragm layer.

Areas 230 produced in the preceding step are used to influence the substrate material located beneath extended area 220 in such a way that this material is etched faster than the remaining substrate material, for example via a higher p-doping of the substrate material. Undercutting in area 235 beneath extended area 220 is thus achieved during removal of the substrate material or production of porous area 250, while the n-doped areas are not or not significantly etched.

FIG. 2c shows the result of the manufacturing method described above prior to removing diaphragm 205 or diaphragm layer 200. It is clear that further layers have been applied to diaphragm layer 200 by additional method steps, for example in the form of piezoelectric resistors, passivation layers, circuit elements or other functional elements, resulting in a (closed) diaphragm 205. A cavity 255 is produced beneath this diaphragm 205, for example by completely removing the substrate material or by subsequently annealing the porous semiconductor material. A base 245 and thin supporting element 240 situated thereupon are provided as the supporting area of diaphragm 205, the supporting element having been defined by previously produced area 230. If diaphragm 205 (or only contiguous diaphragm layer 200) is then removed from substrate 100 in a subsequent step by a suitable gripping process, breakage occurs at the mechanically thinnest point, i.e., at supporting element 240. Since this supporting element 240 has a very thin design, the breakage takes place in a highly controlled manner, resulting in a break edge 270 which runs largely over the width of the supporting element without spreading to diaphragm 205. This preserves the homogeneity of diaphragm 205. Only a small remnant of supporting element 240 remains left over on diaphragm 205, which does not or only insignificantly influences the diaphragm characteristics, e.g. its vibration characteristic or temperature performance. If supporting element 240 is provided in a central location, the remnant left over on diaphragm 205 should even have a vibration-neutral performance.

Depending on the design of the structure, outer limits to cavity 255 may be provided for each component as connecting components 260 between diaphragm 205 and substrate 100. Since these connecting components occur in the outer area of diaphragm 205, which is ordinarily used for attachment in a frame, selective control of the break edge is usually not necessary. However, it may also be provided to use designs corresponding to area 230 or 235 for connecting components 260 in the outer area of cavity 255.

Figure 3A:
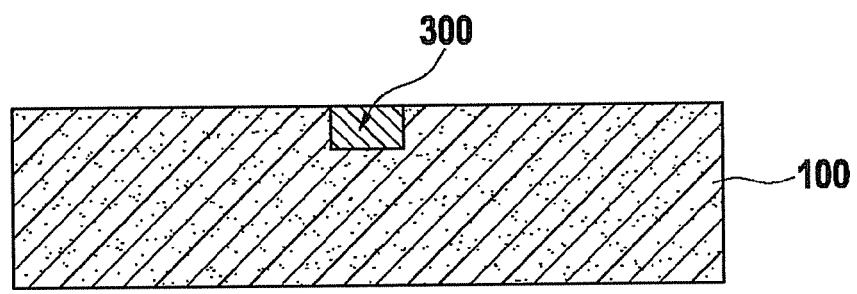

A second exemplary embodiment is illustrated according to FIGS. 3a through 3d. As shown in FIG. 3a, an n-doped area 300 is first introduced into substrate 100.

Figure 3B:
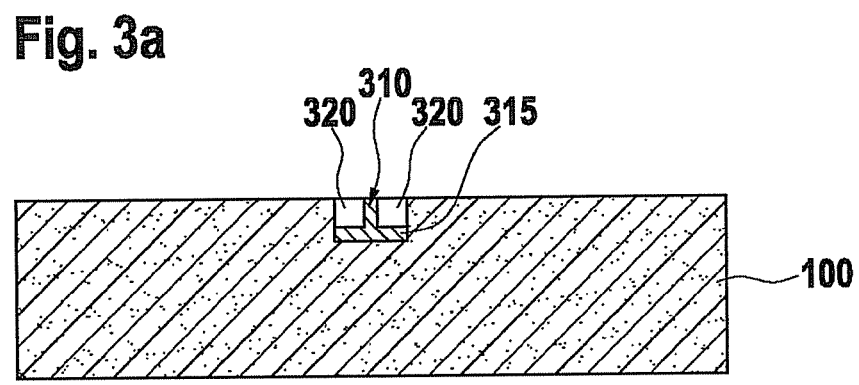

According to FIG. 3b, this area 300 is reverse-doped in a further doping step in such a way that a shallower p-doped area 320 is produced, which defines a supporting point 310 running to the surface and an underlying base 315 which is formed from originally n-doped area 300.

Figure 3C:
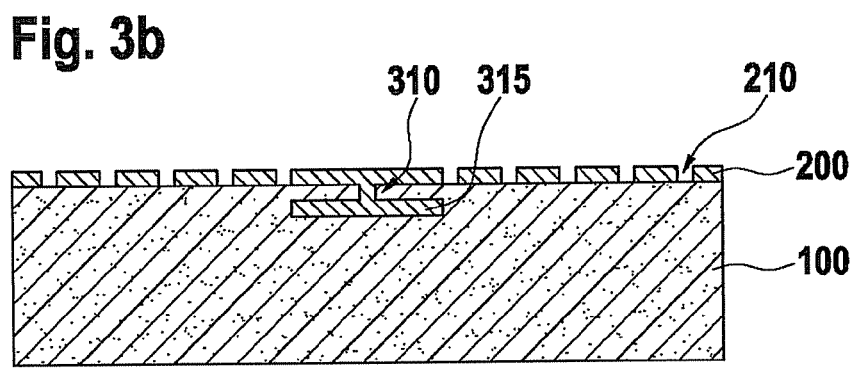

As shown in the preceding exemplary embodiment, a diaphragm layer 200 having openings 210 is produced according to FIG. 3C. Once again, this diaphragm layer 200 may be manufactured by n-doping substrate 100, followed by structuring openings 210, or by epitactic, structured growth.

By removing the semiconductor material in area 320 beneath structured diaphragm layer 200 up to base 315, diaphragm 205 is exposed and connected to substrate 100 only by supporting element 310. As illustrated above, produced diaphragm 205 or diaphragm layer 200 may be removed from substrate 100 in a subsequent pick-and-crack process by producing a breakage of supporting element 310. Break edge 310 remains limited to supporting element 310, which avoids damage to diaphragm 205.

Figure 3D:
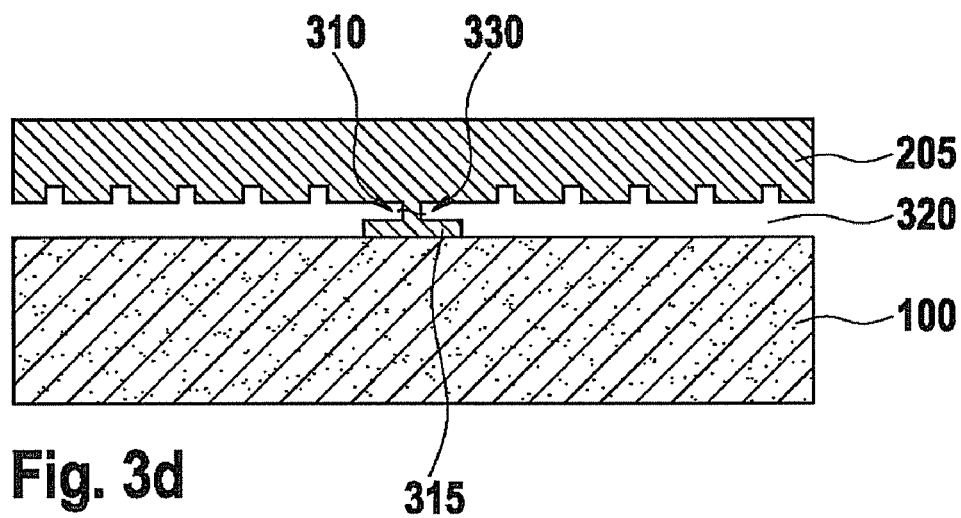
Figure 4:
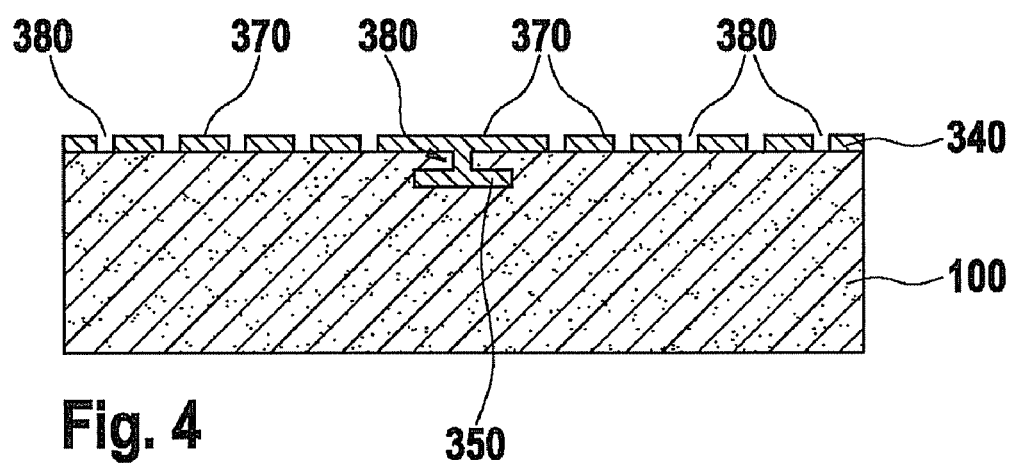

A further option for producing base 350 and supporting element 360 is shown in FIG. 4. In contrast to the preceding exemplary embodiments, the structure including the base and supporting element is produced with the aid of doping steps using the same doping type. Thus, in a first doping step, a deep n-doping is carried out to produce base 350. In a second doping step, supporting element 360 is subsequently produced with the aid of a medium-deep n-doping. Finally, structured diaphragm layer 340 having non-doped openings 380 may be formed via a shallow n-doping. In a subsequent etching step, the substrate material is then removed through openings 380 in such a way that only the interconnected superficial structure including n-doped areas 370 and supporting points remain, as illustrated in FIG. 3d.

Figure 5A:
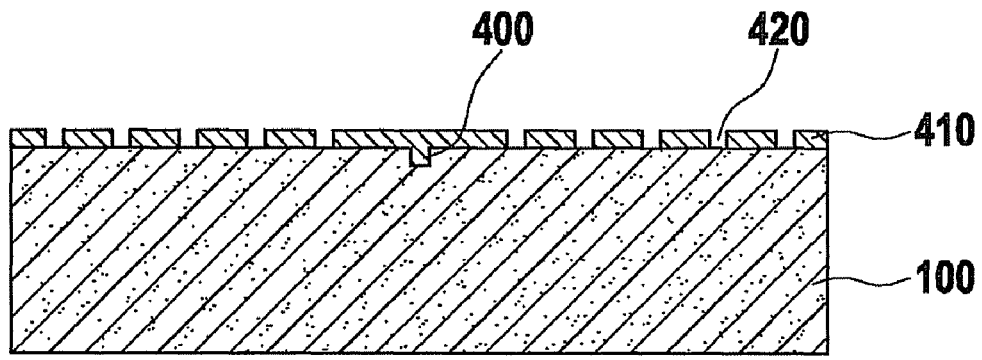

In an alternative exemplary embodiment according to FIG. 5a, only a medium-deep n-doped area is produced to form supporting element 400 in substrate 100. A preferably n-doped diaphragm layer 410 having openings 420 may subsequently be applied, e.g., by epitactic means. It is also optionally possible to introduce diaphragm layer 410 into the surface of substrate 100 by shallower n-doping.

Figure 5B:
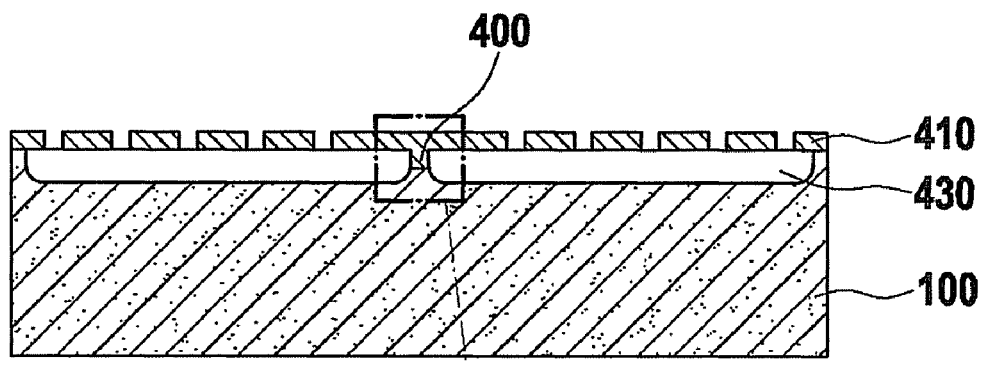
Figure 5C:
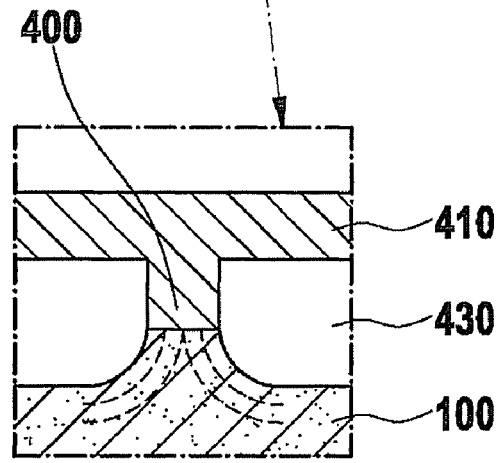

In the subsequent anodizing step, fluctuations in the etching rate during formation of cavity 430 may be absorbed, as shown in FIG. 5b. The detail in FIG. 5c illustrates the fact that the etching process during this procedure exerts a much stronger influence on the connection of supporting element 400 to the bottom of cavity 430 in substrate 100.

To avoid deep doping (high-energy implantation) in the different supporting point variants, the n-type lattice may be alternatively produced by growing a p-doped Si layer, followed by n-doping.

Figure 6A:
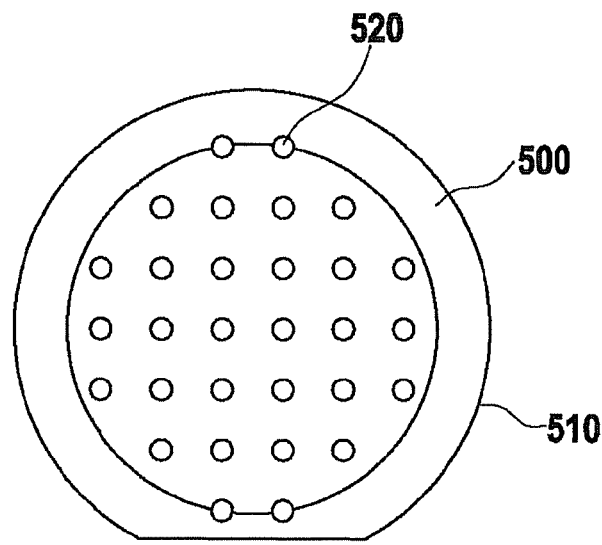
FIGS. 6a, 6b and 7 show exemplary representations of how the components may be produced according to the present invention in a larger wafer assembly.
Figure 6B:
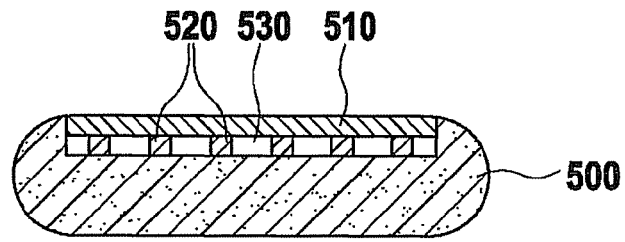
Figure 7:
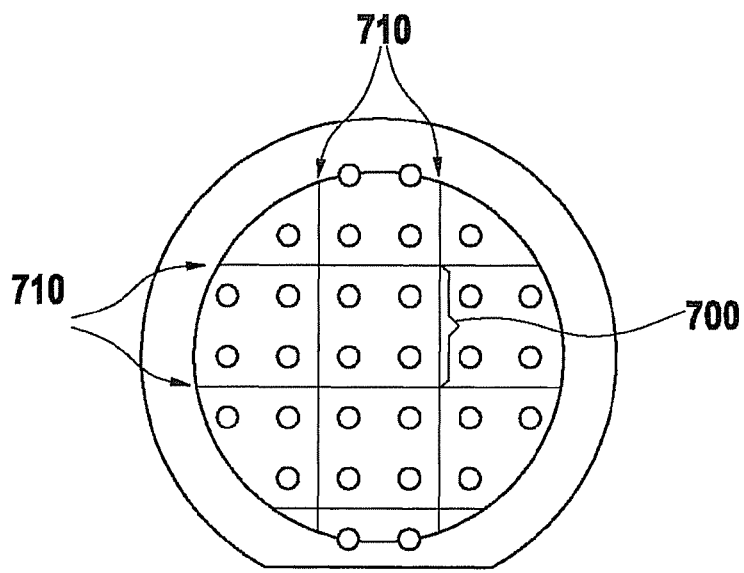

FIGS. 6a and 6b show the manufacture of the component in a wafer assembly. Diaphragm layer 510, which passes over multiple components, is produced on a wafer 500, a shared cavity 530 being produced beneath diaphragm layer 510 and numerous supporting points 520 being provided, which support diaphragm layer 510 (the supporting points are buried in FIG. 6a and therefore are not visible when viewed from above). After separation of continuous diaphragm layer 510 along lines 710, e.g., using a trench-etching process or a sawing process, individual components 700 are gripped by a correspondingly suitable gripper and lifted off the wafer/substrate by breaking off the supporting points. As shown in FIG. 7, it may also be provided that the supporting points may be situated not only in a central location beneath component 700, but also in a decentralized location.

What is claimed is:

1. A micromechanical method for manufacturing a component, comprising:
    producing a defined first structured area in a surface of a substrate for forming a supporting area by a doping process;
    producing a structured doped layer above the first area for forming a diaphragm layer;
    removing at least a portion of a substrate material for forming a cavity area beneath the diaphragm layer, the diaphragm layer remaining substantially connected to the substrate over the first area; and
    separating the diaphragm layer from the substrate by a mechanical breaking process for forming the component,
    wherein the first area is structured in such a way that the breaking process substantially occurs in the first area and not in the diaphragm layer.

2. The method according to claim 1, wherein the structuring in the first area is used to produce a base and a supporting element on the base, via which a mechanical connection is formed between the substrate and the diaphragm layer.

3. The method according to claim 1, wherein the first area is produced in a central area of the diaphragm layer and thus of the component to be formed.

4. The method according to claim 1, wherein the first area is structured by doping the substrate, a reverse-doping of the substrate being provided.

5. The method according to claim 4, wherein the first area is produced by an at least dual doping process, the doping processes doping or reverse-doping the substrate at different depths.

6. The method according to claim 1, wherein at least one of the diaphragm layer and a supporting point have n-doping.

7. A micromechanical component comprising:
    a diaphragm layer including at least one doped layer; and
    at least one doped supporting area, the supporting area having a mechanical break edge which does not extend into the diaphragm layer.

8. The micromechanical component according to claim 7, wherein the supporting area is situated in a central area of the diaphragm layer.

9. The micromechanical component according to claim 7, wherein the supporting area is a thickening of the diaphragm layer.

10. The micromechanical component according to claim 7, wherein the layer in the diaphragm layer and the supporting area have different dopings, the supporting area having an n-doping.

* * * * *